(12) United States Patent
Lee et al.

(10) Patent No.: US 8,866,557 B2
(45) Date of Patent: Oct. 21, 2014

(54) XTAL OSCILLATOR

(75) Inventors: Chang-Hyeon Lee, Irvine, CA (US);
Lindel Kabalican, Temecula, CA (US)

(73) Assignee: Broadcom Corporation, Irvine, CA (US)

( * ) Notice: Subject to any disclaimer, the term of this patent is extended or adjusted under 35 U.S.C. 154(b) by 105 days.

(21) Appl. No.: 13/601,422

(22) Filed: Aug. 31, 2012

(65) Prior Publication Data

US 2014/0062609 A1   Mar. 6, 2014

(51) Int. Cl.
*H03B 5/36* (2006.01)

(52) U.S. Cl.
CPC ........................ *H03B 5/364* (2013.01)
USPC ........ 331/116 FE; 331/158; 331/74; 331/185

(58) Field of Classification Search
CPC .......... H03B 5/3264; H03B 5/32; H03B 5/38; H03B 2200/0034; H03B 2200/0036; H03B 2200/0062; H03B 2200/007; H03B 2200/088; H03B 2202/027; H03B 2202/06

USPC ................... 331/116 R, 116 FE, 158, 74, 185
See application file for complete search history.

(56) References Cited

U.S. PATENT DOCUMENTS

| | | | | |
|---|---|---|---|---|
| 6,091,307 | A * | 7/2000 | Nelson | 331/109 |
| 6,577,204 | B2 * | 6/2003 | Midtgaard | 331/158 |
| 6,696,899 | B2 * | 2/2004 | Ruffieux | 331/154 |
| 6,927,640 | B2 * | 8/2005 | Gomez | 331/116 FE |
| 7,157,980 | B2 * | 1/2007 | Ogiso | 331/34 |
| 7,414,474 | B2 * | 8/2008 | Yamada et al. | 330/255 |
| 7,768,359 | B2 * | 8/2010 | Chang et al. | 331/116 FE |

* cited by examiner

*Primary Examiner* — Ryan Johnson
(74) *Attorney, Agent, or Firm* — Garlick & Markison; Randy W. Lacasse (57) ABSTRACT

Resistor bias circuitry is included in components of an XTAL oscillator system to reduce 1/f noise. An XTAL oscillator includes a resistor bias circuit attached to the XTAL core. A common mode feedback OP amp connected to the XTAL core also includes a resistor bias circuit. An XTAL oscillator chain includes an XTAL core, common mode feedback OP amp, common mode logic buffer (CML BF), and differential to CMOS converter (D2C) each with resistor bias circuitry.

20 Claims, 11 Drawing Sheets

XTAL OSCILLATOR

BACKGROUND OF THE INVENTION

1. Technical Field of the Invention

This invention relates generally to communications and more particularly to timing circuits used to support cable, satellite, and wireless communications.

2. Description of Related Art

Communication systems are known to support wireless and wireline communications between wireless and/or wireline communication devices. Such communication systems include, for example, national and/or international cellular telephone systems, satellite, cable television, the Internet, point-to-point in-home wireless networks and radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof. There are three main television standards used throughout the world—NTSC (National Television Standards Committee), SECAM (Système Électronique pour Couleur avec Mèmoire) and PAL (Phase Alternating Line).

Depending on the type of communication system, for example a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain.

The oscillations needed in such wireless circuits as well as those needed in systems such as set top boxes and satellite tuners, must be very precise, with high reliability, and very low noise. A crystal oscillator (XTAL oscillator) is an electronic oscillator circuit that uses the mechanical resonance of a vibrating crystal of piezoelectric material to create an electrical signal with a very precise frequency. This frequency is commonly used to keep track of time, to provide a stable clock signal for digital integrated circuits, and to stabilize frequencies for radio transmitters and receivers. Most are used for consumer devices such as radios, computers, television tuners, set-top boxes, and cellphones.

Local oscillator signals used in cellular telecommunications applications must be highly stable. Since crystals, such as quartz, have an extremely high Q, crystal oscillators are often utilized to provide the necessary frequency stability. Typically, quartz crystals are cut and mounted to vibrate best at a desired resonant frequency or an overtone (multiple) of the desired resonant frequency. When the crystal is vibrating, the crystal can be modeled as an RLC circuit that produces a rapidly changing reactance with frequency, with the RLC circuit providing positive feedback and gain at the resonant frequency, leading to sustained oscillations.

Typically, the regular current mirror for XTAL biasing has lower signal-to-noise ratios (SNRs) due to 1/f noise, which cannot achieve better than −130 dBc/Hz spot phase noise (PN) at 1 KHz. Phase noise is the frequency domain representation of rapid, short-term, random fluctuations in the phase of a waveform, caused by time domain instabilities ("jitter"). Known use of an RC filter to filter the 1/f noise is very expensive with long startup times as the corner frequency is set to less than 1 KHz. Alternately, inverter based XTAL oscillators may have excessive loop gain variation over process-voltage-temperature (PVT) to produce an oscillation condition.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages

DETAILED DESCRIPTION OF THE INVENTION

Figure 1:
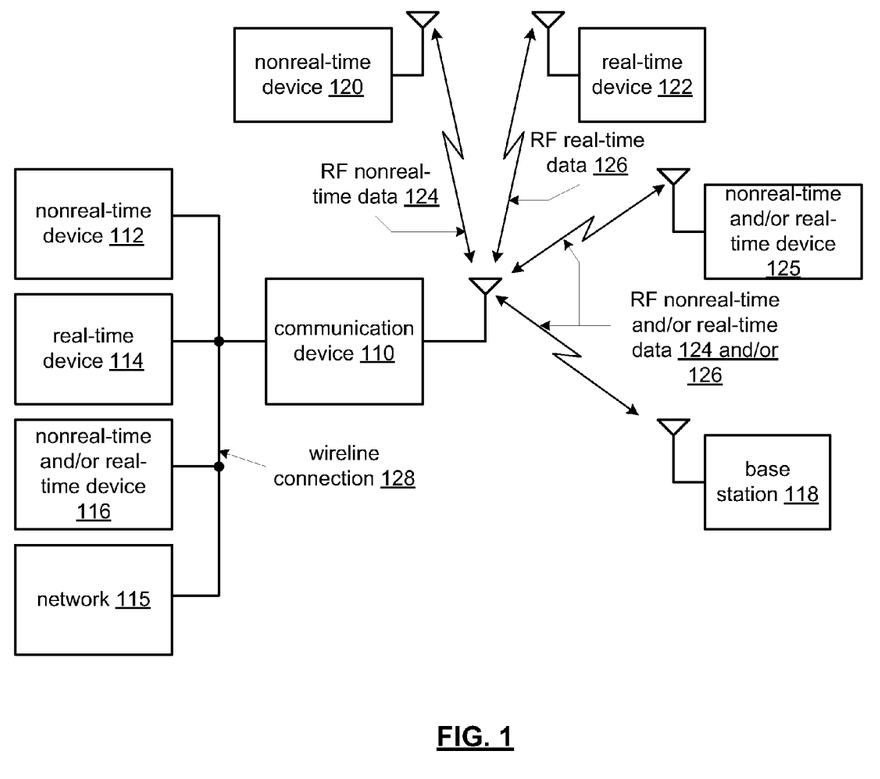
FIG. 1 is a schematic block diagram of an embodiment of a wireless communication system.

FIG. 1 is a schematic block diagram of a communication system in accordance with the technology described herein. In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114, 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the technology described herein. Such wireless transceivers shall be described in greater detail in association with FIGS. 2-13 that follow.

Figure 2:
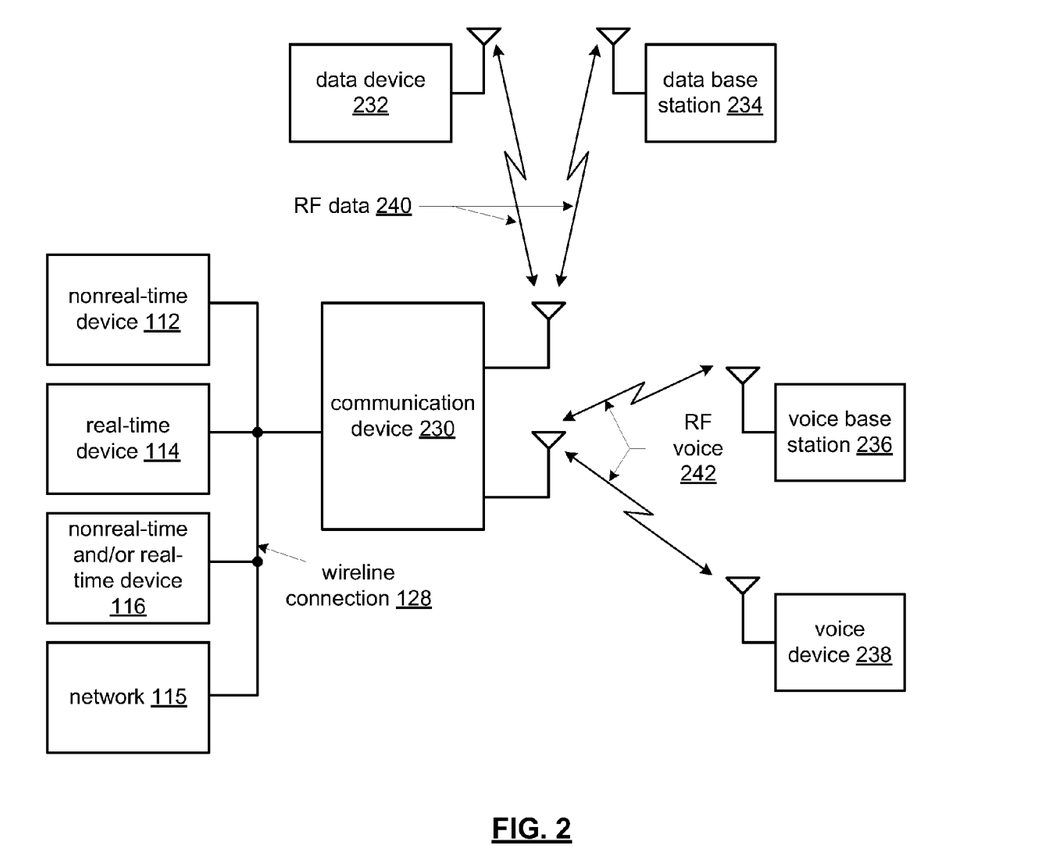
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
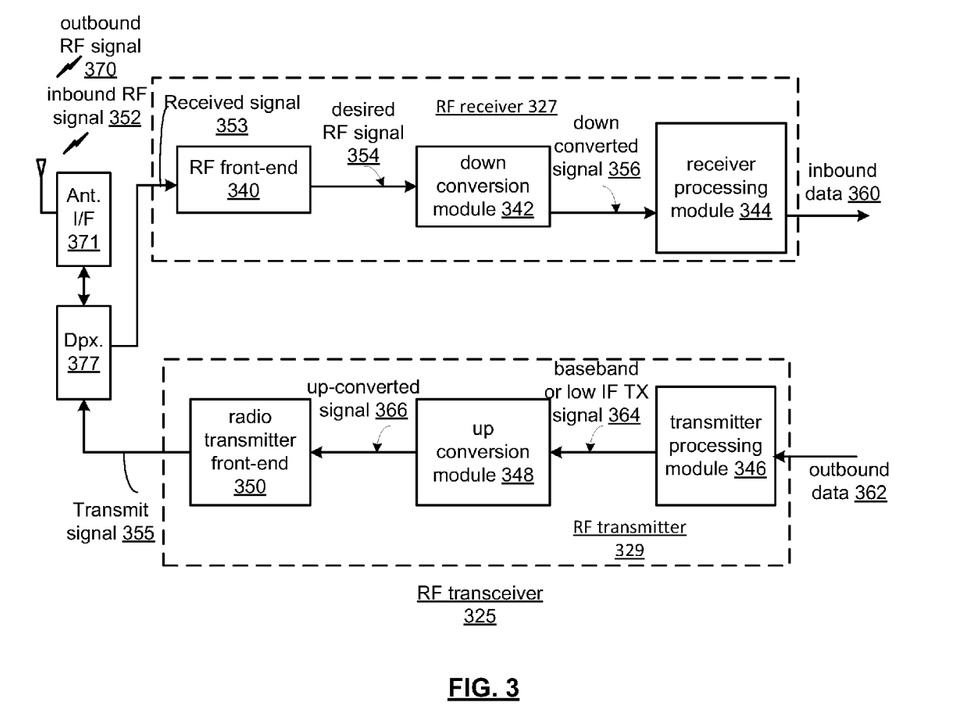
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
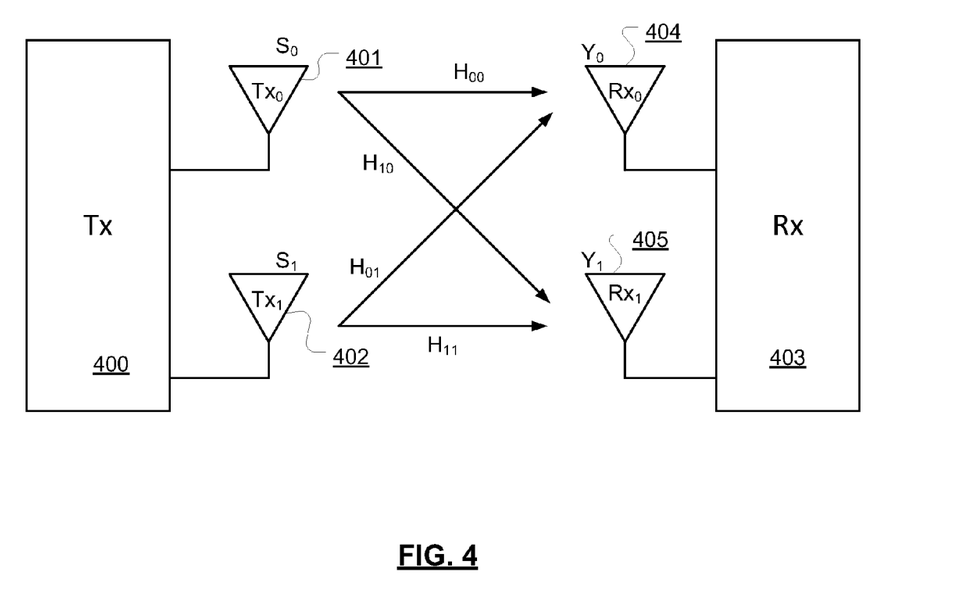
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx-Rx}$ notation) and the data path is referred to as channel H. While, the example illustrated is a two antenna structure, the embodiments disclosed herein may operate within other known antenna configurations (e.g., 2×4, 2×8, 4×16, etc.)

Further details including optional functions and features of the RF transceiver are discussed in conjunction with FIGS. 5-13 that follow.

As previously mentioned, local oscillator signals used in cellular telecommunications applications must be highly stable. When the crystal is vibrating, the crystal can be modeled as an RLC circuit that produces a rapidly changing reactance with frequency, with the RLC circuit providing positive feedback and gain at the resonant frequency, leading to sustained oscillations. The oscillator technology disclosed herein is used in various embodiments to provide a stable, low jitter/noise solution.

Figure 5:
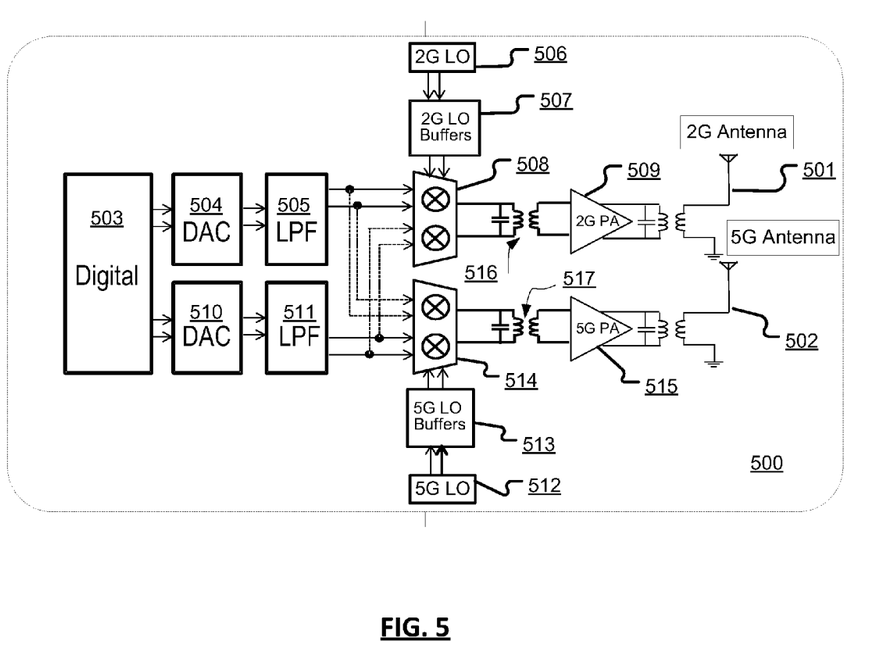
FIG. 5 illustrates an embodiment for 3 GHz and 5 GHz oscillators used within a multi-band transmitter.

In one example embodiment, the XTAL oscillator described herein operates within wireless transceiver circuits as part of a local oscillator (LO) such as the one shown in FIG. 5. The XTAL oscillator, in some embodiments, will undergo frequency conversion from typical sub 200 MHz frequency ranges to GHz frequency ranges using known methods (e.g., phase-locked loop PLL frequency synthesizers using the XTAL oscillator as a reference). As shown, 3 GHz (506) and 5 GHz (512) local oscillators are used within a multi-band transmitter employing mixers and corresponding LO buffers for each band. In this embodiment, multi-band transmitter 500 includes dual transmission bands centered around 2 GHz and 5 GHz transmitted from antennas 501 and 502, respectively. The transmission bands are typically around 40+MHz wide. However, the number of bands, frequencies selected and band width ranges can be modified without departing from the scope of the presently described embodiments. Local oscillators LO2 and LO5 provide the required frequencies for transmission in these bands.

In operation, digital processing input stage(s) 503 produce distinct processing chains to process output distinct digital communication signals (bands). The two processing chains each include a digital-to-analog converter (DAC) 504 and 510 (respectively) producing two analog bands which are low-pass filtered (LPF) by filters 505 and 511, respectively. The filtered signals are passed to mixers 508 and 514 which include inputs from local oscillators (LO) 506 (2G) and 512 (5G) through corresponding LO buffers 507 and 513. The mixers are used to up-convert their respective input communication bands into the desired RF bands, in this example 2 GHz and 5 GHz (respectively). Up-converted RF band signals are passed to tuning stages 516 and 517 and amplification stages (power amplifiers (PA) 509 and 515) and to their respective transmission antennas 501 and 502.

Further details including optional functions and features of the XTAL oscillators are discussed in conjunction with FIGS. 6-13 that follow.

Figure 6:
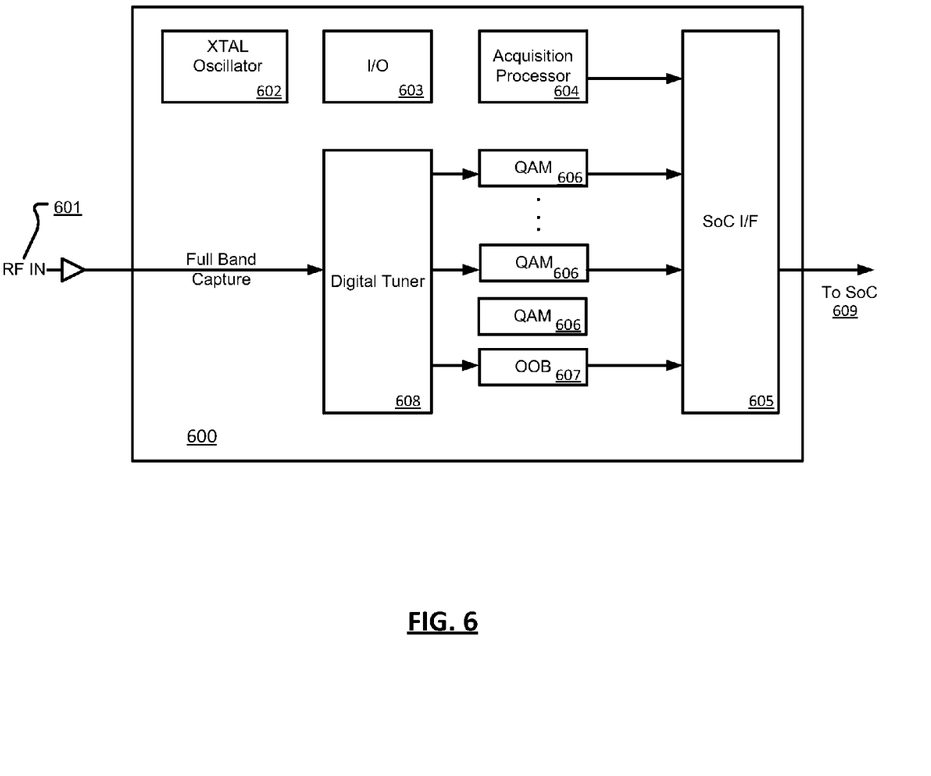
FIG. 6 illustrates an embodiment for an XTAL oscillator described herein which operates within a cable television tuner circuit.

In another example embodiment, the XTAL oscillator described herein operates within cable television tuners circuits such as the one shown in FIG. 6. As shown, XTAL oscillator 602 is used within, for example, a full-band capture cable digital tuner 600 as produced by Broadcom of Irvine, Calif., USA. FIG. 6 includes a full-band capture of amplified input RF signal 601. In this embodiment, XTAL oscillator 602 provides timing (clock signals) for the tuner circuit which includes digital tuner 608, associated quadrature amplitude modulation (QAM) demodulators 606, and out-of-band (OOB) receiver 607. Additional elements include input/output (I/O) 603 and acquisition processor 604. Elements 604, 606, and 607 feed into system-on-a chip (SoC) circuitry 605 and external SoC devices 609. While shown in cable television tuners circuits, the technology described herein is equally applicable to any device/circuit which requires accurate, low noise/jitter, reliable oscillators, such as, but not limited to timing circuits, set-top boxes, satellite tuners, base stations and mobile handsets.

Further details including optional functions and features of the XTAL oscillators are discussed in conjunction with FIGS. 7-13 that follow.

Figure 7:
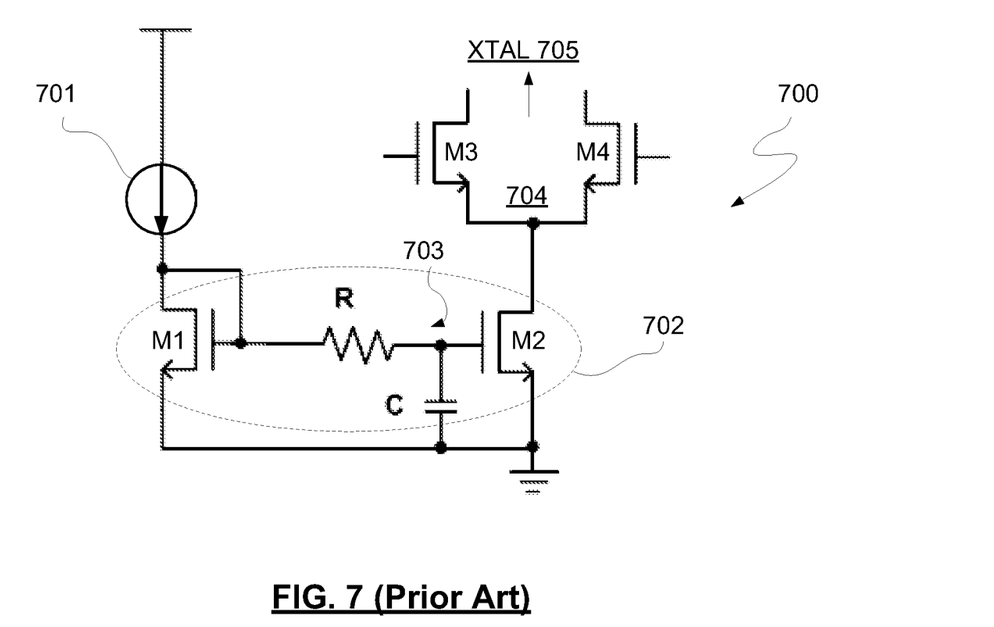
FIG. 7 illustrates prior art using a big RC filter to filter 1/f noise at a current mirror.

FIG. 7 illustrates one embodiment of a prior art noise reduction technique that utilizes a large RC filter to filter 1/f noise at the current minor. Typically, the regular current mirror for XTAL biasing has a lower SNR due to 1/f noise. Using an RC filter to filter the 1/f noise is expensive and startup times are slow when, for example, its corner frequency is set to less than 1 KHz. Flicker noise in the bias current upconverts through the mixing action of the commutating differential pair into AM sidebands around the XTAL oscillation frequency. As shown, circuit 700 includes current generator 701, current mirror 702 comprised of transistors M1 and M2 and RC filter 703 made up of resistor R and capacitor C, and transistor core connections 704 (transistors M3 and M4) to XTAL 705 (core not shown).

Figure 8:
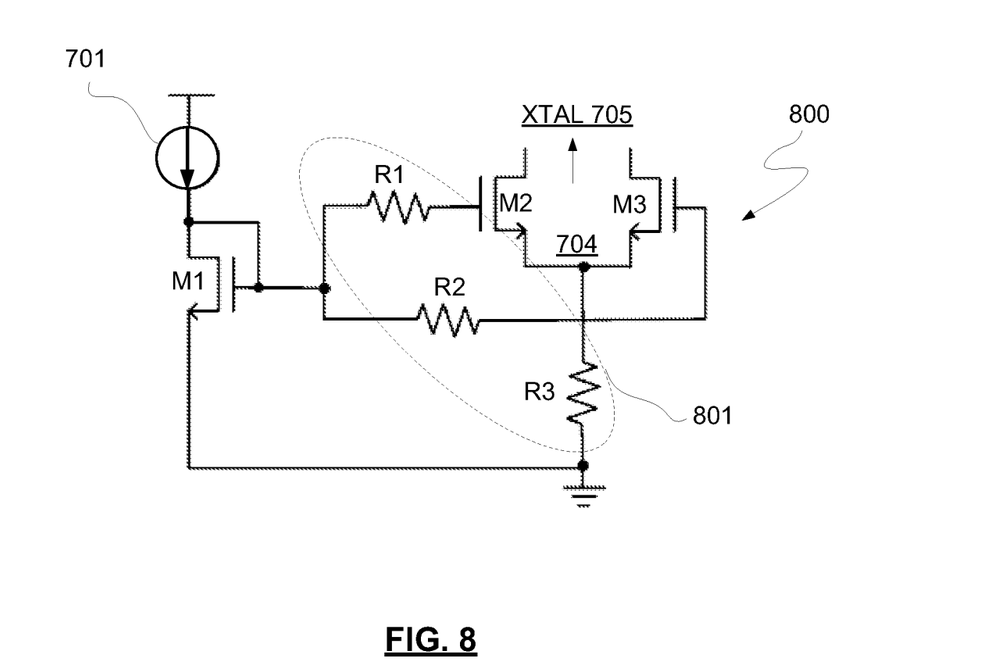
FIG. 8 illustrates an embodiment using simplified resistor bias circuit for XTAL.

FIG. 8 illustrates one embodiment of the technology described herein comprising suitable hardware/software in the form of circuitry, logic gates, and/or code that functions to integrate resistor bias (R bias) without the RC filter circuit of FIG. 7. This configuration serves to reduce 1/f noise, for example, in a phase-locked loop (PLL) design since it contributes to low-pass noise characteristics. As shown, circuit 800 includes current generator 701, transistor M1, resistive branch configuration 801 which includes a first branch with resistor R1, a second branch with resistor R2 and a third branch with R Bias resistor R3, and transistor core connection 704 (transistors M2 and M3) to XTAL core 705 (core not shown).

Figure 9:
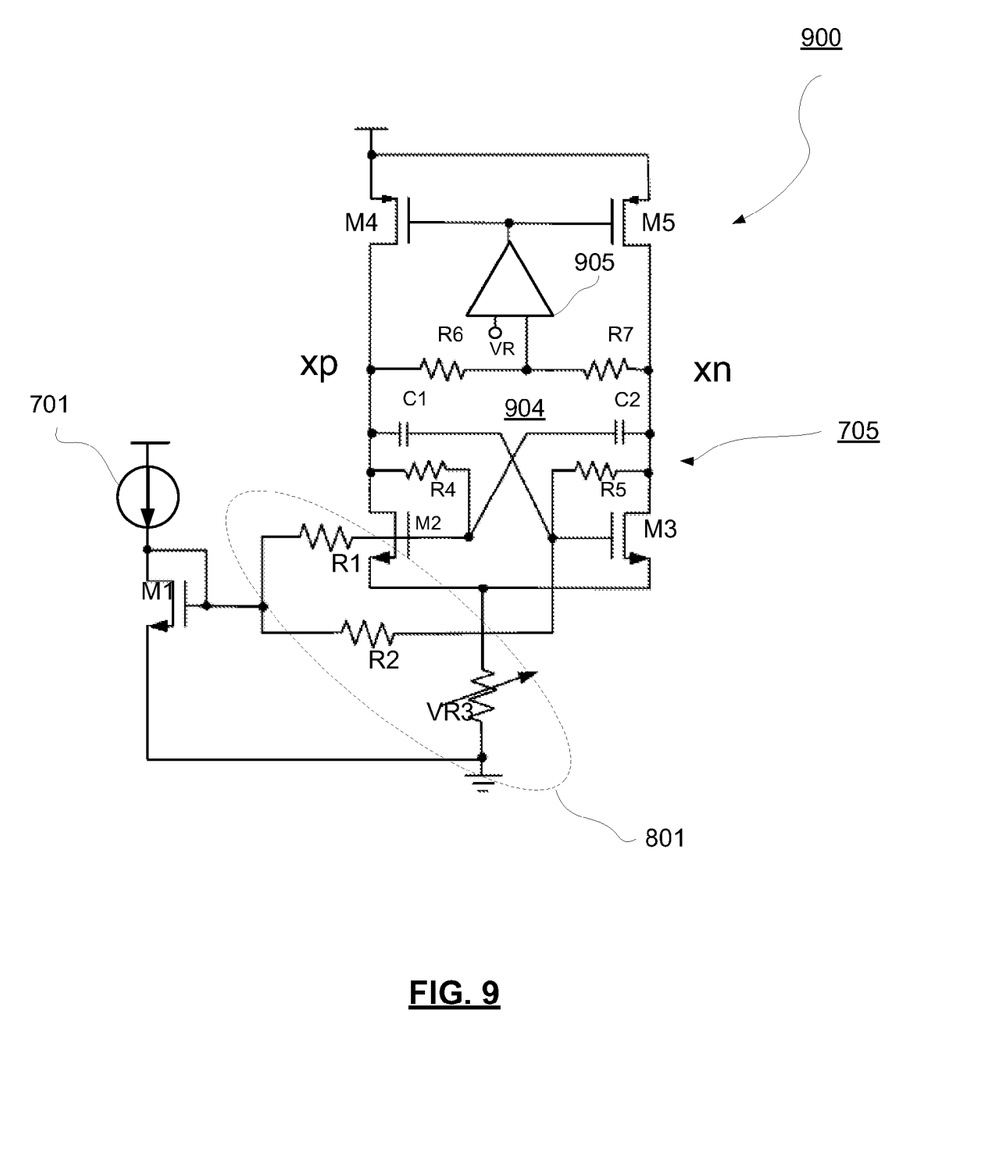
FIG. 9 illustrates one embodiment that functions to implement a XTAL CORE circuit using R bias.

FIG. 9 illustrates one embodiment of the technology described herein comprising suitable hardware/software in the form of circuitry, logic gates, and/or code implementing an XTAL core circuit 900 using the R bias configuration of FIG. 8. In one embodiment, sub-1V operation of the XTAL core 705, the circuit functions to maintain the common voltage level to be slightly higher than half of supply using a common mode feedback circuit. This enables the $x_p$ and $x_n$ signal swing to be maximized. As shown, resistive branch configuration 801 with R bias is connected to a cross-coupled XTAL core 705 (circuit equivalent shown—crystal not shown). Resistive branch configuration 801 includes a first branch with resistor R1, second branch with resistor R2 and third branch with variable resistor VR3 (to vary bias resistance of an input to the core). Cross-coupled XTAL core 705 includes RC high pass filter 904 to enhance the loop gain at the wanted crystal frequency, including transistor M2, capacitor C2, and resistor R4 with mirrored CMOS transistor M3, capacitor C1, and resistor R5. The XTAL core circuit 900 includes common mode feedback OP amp 905 with inputs through resistors R6 and R7 and variable resistor VR, and common mode output through transistors M4 and M5. As further illustrated in FIG. 10, the common mode feedback OP amp 905, in one embodiment, also includes the R bias configuration as described by the technology described herein.

Figure 10:
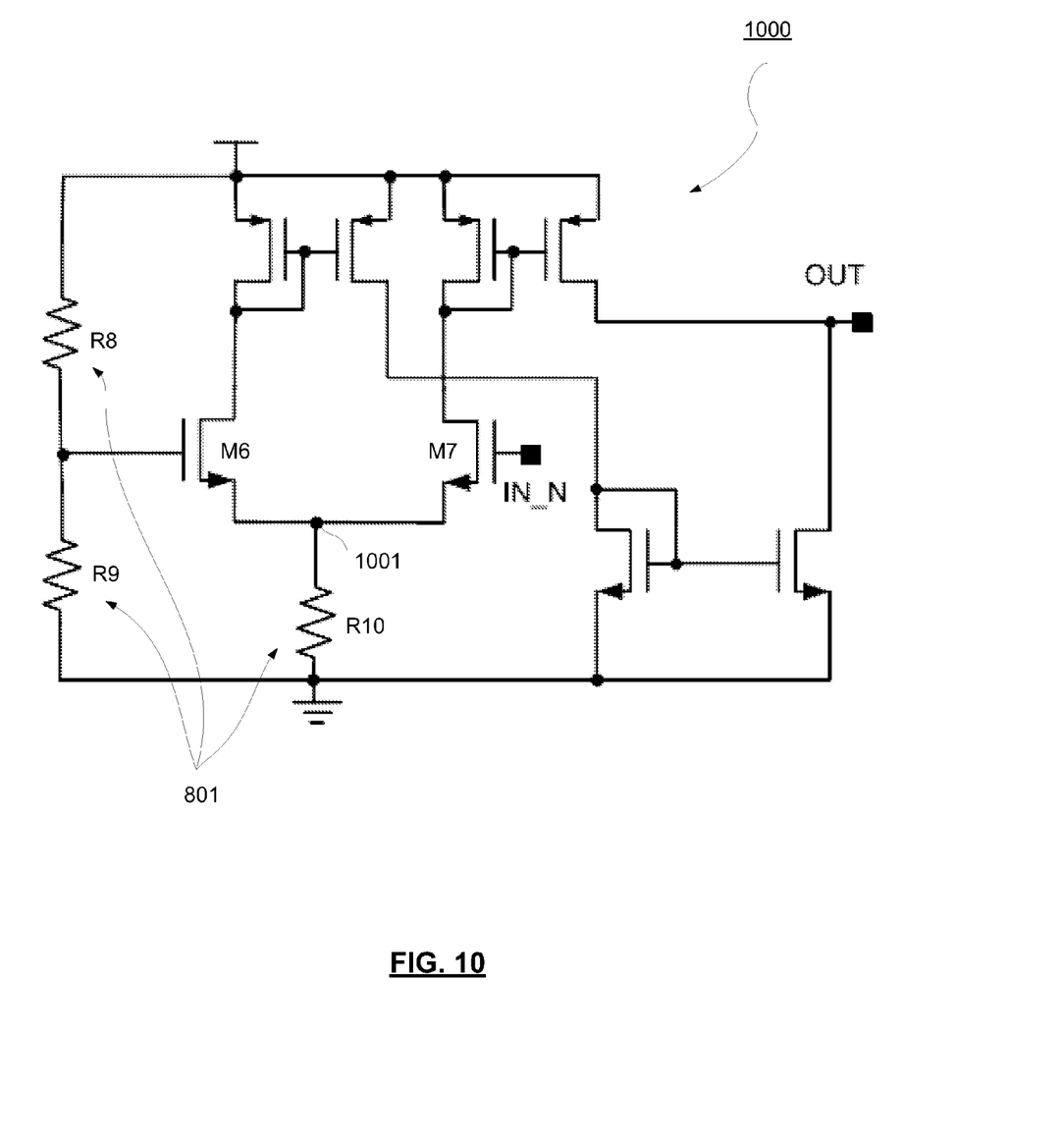
FIG. 10 illustrates one embodiment of the technology described herein which comprises suitable CMOS circuitry to implement an OP AMP for Common mode feedback using R bias.

FIG. 10 illustrates one embodiment of the technology described herein comprising suitable hardware/software in the form of circuitry, logic gates, and/or code that functions to integrate a common mode feedback OP amp with the technology described herein of a resistor bias configuration. As shown, common mode feedback amp 1000 includes resistive branch configuration 801 with R bias. Resistive branch configuration 801 with R bias includes a first branch with resistor R8, second branch with resistor R9 and third branch with resistor R10 with differential transistor connection 1001 (to transistors M6 and M7).

Figure 11:
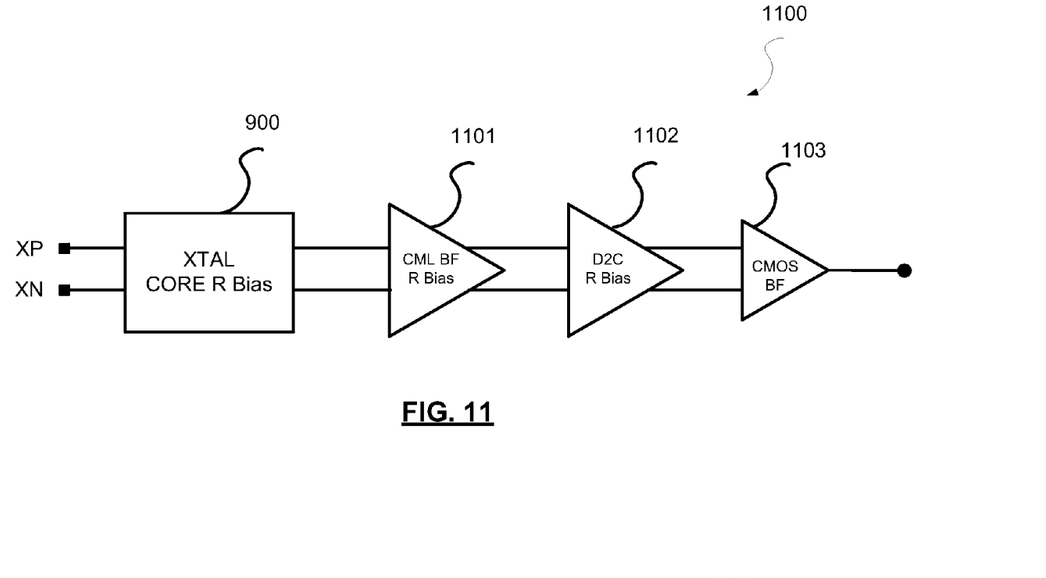
FIG. 11 illustrates an embodiment XTAL system diagram.

FIG. 11 illustrates one embodiment of the technology described herein comprising suitable hardware/software in the form of circuitry, logic gates, and/or code that implements the crystal oscillator (XTAL) system chain 1100. In one embodiment, the chain serves functions to integrate R bias implementation to reduce loop gain variation compared to an inverter based XTAL oscillator. In one embodiment, the optimal bias point for the loop gain should be greater than 1.5 (v/v) at the phase summation of 360°. The R bias with common mode feedback circuit shown in XTAL Core 900 allows for the best phase noise (PN) performance by preventing distortion from unnecessary excessive high loop gain across process-voltage-temperature (PVT). The common mode feedback OP amp (CM FB) inside the XTAL core provides proper biasing to the common mode logic buffer (CML BF) block 1101 also incorporating R bias (shown in further detail in FIG. 12). In previous designs, PN degradation originated from differential to CMOS conversion. In this embodiment, differential to CMOS conversion is performed by a differential to CMOS converter (D2C) 1102 (shown in further detail in FIG. 13) with the technology disclosed herein R bias. Placement of a common-mode logic (CML) buffer between the XTAL core and differential to CMOS converter (D2C) provides sharper edges to the D2C which improves its noise performance. A CMOS buffer (BF) 1103 completes the chain. In the embodiment shown, the chain is designed using R bias to minimize 1/f noise.

Figure 12:
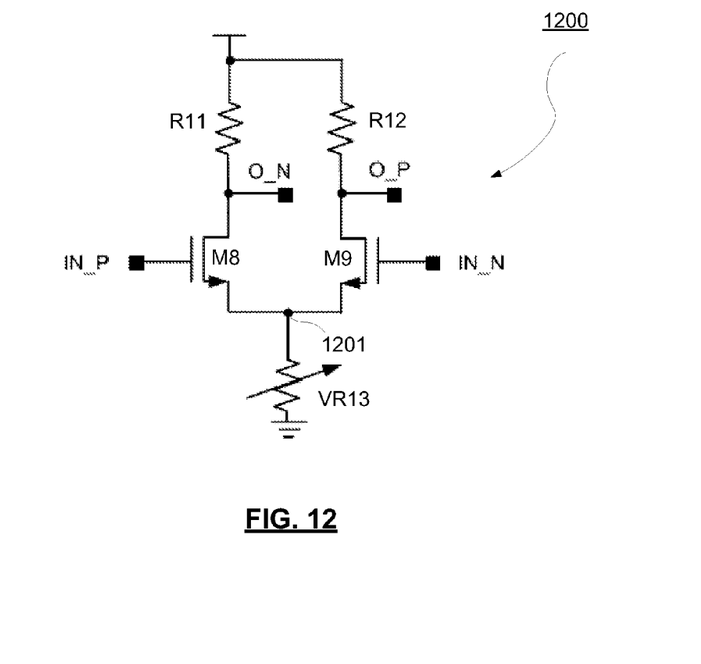
FIG. 12 illustrates an embodiment for a CML buffer circuit using R bias.

FIG. 12 illustrates one embodiment of the technology described herein which comprises suitable hardware/software in the form of circuitry and/or logic gates 1200 that implements R bias for an internal common-mode logic buffer (CML BF 1101) as well as, e.g., an 50 ohm CML output driver, which has divide-by-2 function. This configuration saves bill-of-material's (BOM) cost for a reference board using only a single crystal component. The CML driver output provides reference clocks to the other chips on the board. This maintains the same phase noise performance from the XTAL core phase noise to CML output. The CML output on the printed circuit board (PCB) helps to minimize the XTAL frequency related harmonics by controlling the output driving strength from the R bias variable resistor VR13. As shown, common-mode logic buffer (CML BF 1101) includes a resistive branch configuration with R bias. The resistive branch configuration with R bias includes a first branch with resistor R11, second branch with resistor R12 and third branch with R bias variable resistor VR13 connected at 1201 to differential transistors M8 and M9.

Figure 13:
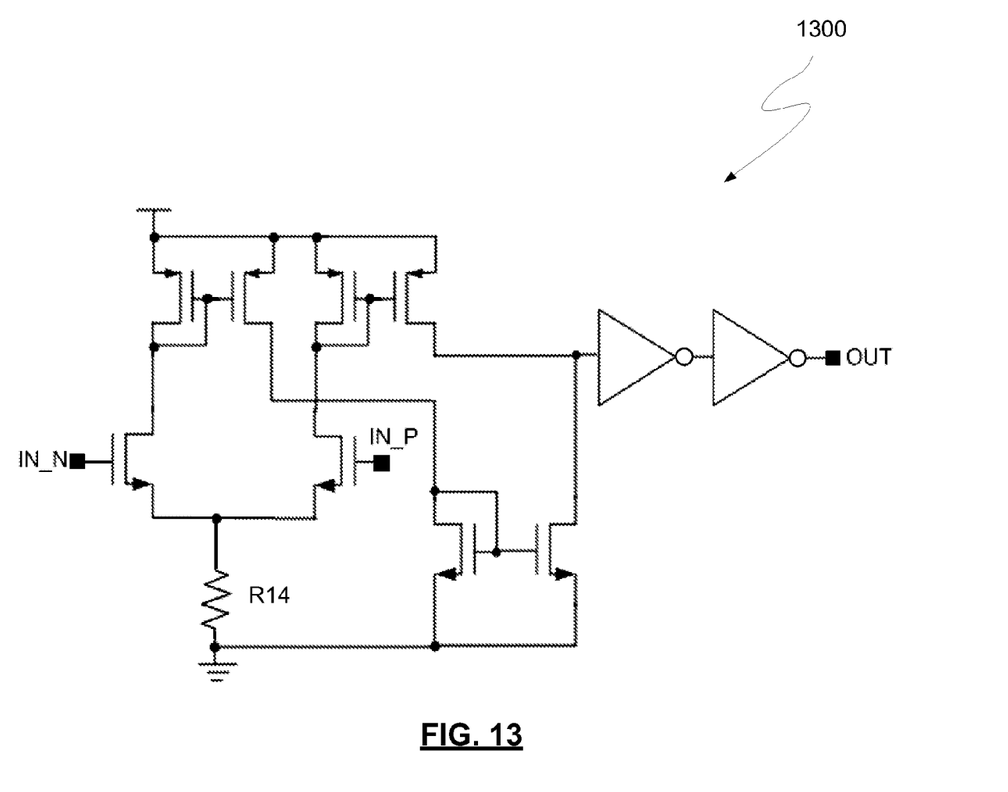
FIG. 13 illustrates an embodiment for that implements R bias for a differential to CMOS converter (D2C).

FIG. 13 illustrates one embodiment of the technology described herein which comprises suitable hardware/software in the form of circuitry and/or logic gates 1300 that implements R bias for an differential to CMOS converter (D2C) 1102. As shown, D2C circuit 1300 is used for CML to CMOS conversion. During conversion, by using current minor bias, there is a chance to upconvert 1/f noise into the XTAL frequency at the switching point. Therefore the D2C circuit using R-bias resistor R14 helps to minimize the 1/f noise modulation.

The various embodiments enjoy certain circuit advantages, such as, but not limited to: smaller silicon circuit area since R bias gets rid of a big RC filter; 0.9V supply XTAL spot PN using R bias from 10 KHz-to-1 MHz is flat as −148 dBc/Hz; 1.8V supply XTAL spot PN using R bias from 10 KHz-to-1 MHz is flat as −158 dBc/Hz, and well controlled XTAL loop gain allowing optimal bias settings for the best PN performance at low power supply operation.

The various embodiments enjoy certain system advantages, such as, but not limited to: ultra-low phase noise using R bias allows more phase noise margin at the system level clock output; since the XTAL determines the system noise floor, the ultra-low PN XTAL gives room for system design to reduce system clock jitter in the SoC domain.

The various embodiments enjoy certain product advantages, such as, but not limited to: lower power dissipation and smaller silicon area allows less silicon cost and ultra-low phase noise using R bias.

Throughout the specification, drawings and claims various terminology is used to describe the various embodiments. In telecommunications, the terms multi-band, dual-band, tri-band, quad-band and penta-band refer to a device (especially a mobile phone) supporting multiple radio frequency bands. All devices which have more than one channel use multiple frequencies; a band however is a group of frequencies containing many channels. Multiple bands in mobile devices support roaming between different regions where different standards are used for mobile telephone services. Where the bands are widely separated in frequency, parallel transmit and receive signal path circuits must be provided, which increases the cost, complexity and power demand of multi-band devices.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A crystal oscillator comprising:
a crystal oscillator core;
a current generator;
a transistor (M1) coupled to an output of the current generator and to a first resistor bias circuit further operatively coupled to the crystal oscillator core;
a second resistor bias circuit coupled to the transistor (M1) and further coupled to the crystal oscillator core between ground and a common input to the crystal oscillator core, and
wherein at least the second resistor bias circuit reduces noise of the crystal oscillator.

2. A crystal oscillator, as per claim 1, wherein the crystal oscillator core further comprises a cross-coupled RC circuit operatively coupled to the first bias circuit.

3. A crystal oscillator, as per claim 1, wherein the crystal oscillator further comprises a common mode feedback OP amp.

4. A crystal oscillator, as per claim 3, wherein the common mode feedback OP amp further comprises a third resistor bias circuit.

5. A crystal oscillator, as per claim 4, wherein the third resistor bias circuit comprises: a first branch with a first resistor coupled between a first common mode feedback OP amp transistor and a second common mode feedback OP amp transistor, a second branch with a second resistor coupled between the second common mode feedback OP amp transistor and ground, and a third branch with a third resistor coupled between ground and a common input to the common mode feedback OP amp.

6. A crystal oscillator, as per claim 1, further comprising a common mode logic buffer.

7. A crystal oscillator, as per claim 6, wherein the common mode logic buffer further comprises a fourth resistor bias circuit.

8. A crystal oscillator, as per claim 1, further comprising a differential to CMOS converter.

9. A crystal oscillator, as per claim 8, wherein the differential to CMOS converter further comprises a fifth resistor bias circuit.

10. A crystal oscillator, as per claim 1, further comprising an output CMOS buffer.

11. A crystal oscillator, as per claim 1, wherein the crystal oscillator is operative in any of: set top box, satellite tuner, base station, mobile communications circuitry, LTE circuitry and MIMO circuitry.

12. A crystal oscillator, as per claim 1, wherein the crystal oscillator is operative in a phase-locked loop.

13. A crystal oscillator, as per claim 1, wherein the crystal oscillator provides timing signals to chips within communication systems.

14. A crystal oscillator system comprising:
- a crystal oscillator core with first resistance bias circuitry;
- a common mode feedback OP amp operative with the crystal oscillator core, the common mode feedback OP amp further comprising second resistance bias circuitry;
- a common mode logic buffer coupled to the crystal oscillator core and further comprising third resistance bias circuitry;
- a differential to CMOS converter connected to the common mode logic buffer and further comprising fourth resistance bias circuitry, and
- wherein each of the resistance bias circuits reduces jitter of the crystal oscillator system.

15. A crystal oscillator, as per claim 14, further comprising a CMOS output buffer coupled to the differential to CMOS converter.

16. A crystal oscillator system, as per claim 14, wherein the crystal oscillator system is operative in any of: set top box, satellite tuner, base station, mobile communications circuitry, LTE circuitry and MIMO circuitry.

17. A crystal oscillator, as per claim 14, wherein the crystal oscillator is operative in a phase-locked loop.

18. A crystal oscillator system, as per claim 14, wherein the crystal oscillator system provides timing signals to chips within communication systems.

19. A crystal oscillator comprising:
- a crystal oscillator core;
- a current generator;
- a transistor (M1) coupled to an output of the current generator;
- a resistor bias circuit coupled to the crystal oscillator core comprising:
    - a first branch with a first resistor coupled between the transistor (M1) and a transistor (M2) of the crystal oscillator core,
    - a second branch with a second resistor coupled between the transistor (M1) and a transistor (M3) of the crystal oscillator core, and
    - a third branch with a bias resistor coupled between ground and a common input to the crystal oscillator core, and
- wherein the resistance bias circuit reduces 1/f noise of the crystal oscillator.

20. A crystal oscillator, as per claim 19, wherein the crystal oscillator system is operative in any of: set top box, satellite tuner, base station, mobile communications circuitry, LTE circuitry and MIMO circuitry.

* * * * *